United States Patent [19]

Mlavsky

[11] E Re. 29,833

[45] Reissued Nov. 14, 1978

[54] TUBULAR SOLAR CELL DEVICES

[75] Inventor: Abraham I. Mlavsky, Lincoln, Mass.

[73] Assignee: Mobil Tyco Solar Energy Corporation, Waltham, Mass.

[21] Appl. No.: 823,119

[22] Filed: Aug. 9, 1977

Related U.S. Patent Documents

Reissue of:

[64] Patent No.: 3,976,508
Issued: Aug. 24, 1976
Appl. No.: 519,920
Filed: Nov. 1, 1974

[51] Int. Cl.[2] ..... H01L 31/06; F24J 3/02

[52] U.S. Cl. ..... 136/89 PC; 136/89 CC; 136/89 SJ; 136/89 HY; 60/641; 126/270; 126/271; 357/15; 357/20; 357/30

[58] Field of Search ..... 136/89 PC, 89 SJ, 89 CC, 136/89 HY; 250/211 R, 211 J, 212; 357/20, 30, 15; 126/270, 271

[56] References Cited

U.S. PATENT DOCUMENTS

| | | | |
|---|---|---|---|
| 2,946,945 | 7/1960 | Regnier et al. | 136/89 X |
| 3,026,439 | 3/1962 | Geer | 136/89 X |
| 3,122,655 | 2/1964 | Murray | 307/88.5 |
| 3,134,906 | 5/1964 | Henker | 250/211 |
| 3,150,999 | 9/1964 | Rudenberg et al. | 136/89 |
| 3,152,926 | 10/1964 | Power | 136/89 |
| 3,263,101 | 7/1966 | Geer | 136/89 X |
| 3,331,707 | 7/1967 | Werth | 136/89 |
| 3,475,660 | 10/1969 | Coblenz | 357/66 |
| 3,490,950 | 1/1970 | Myer | 136/89 |
| 3,510,714 | 5/1970 | Geer | 136/89 X |
| 3,589,946 | 6/1971 | Tarneja et al. | 136/89 |
| 3,620,847 | 11/1971 | Wise | 136/89 |
| 3,653,971 | 4/1972 | Lidorenko et al. | 136/89 |
| 3,925,802 | 12/1975 | Watanabe | 357/20 |
| 3,969,163 | 7/1976 | Wakefield | 148/174 |
| 3,990,914 | 11/1976 | Weinstein et al. | 136/89 |

FOREIGN PATENT DOCUMENTS

| | | |
|---|---|---|
| 657,485 | 9/1951 | United Kingdom. |
| 1,154,043 | 6/1969 | United Kingdom. |

*Primary Examiner*—John H. Mack
*Assistant Examiner*—Aaron Weisstuch
*Attorney, Agent, or Firm*—Schiller & Pandiscio

[57] ABSTRACT

Tubular solar cells are provided which can be coupled together in series and parallel arrays to form an integrated structure. Solar energy concentrators are combined with the solar cells to maximize their power output. The solar cells may be cooled by circulating a heat exchange fluid through the interior of the solar cells and the heat captured by such fluid may be utilized, for example, to provide hot water for a heating system. The coolant circulating system of the solar cells also may be integrated with a solar thermal device so as to form a two-stage heating system, whereby the coolant is preheated as it cools the solar cells and then is heated further by the solar thermal device.

37 Claims, 15 Drawing Figures

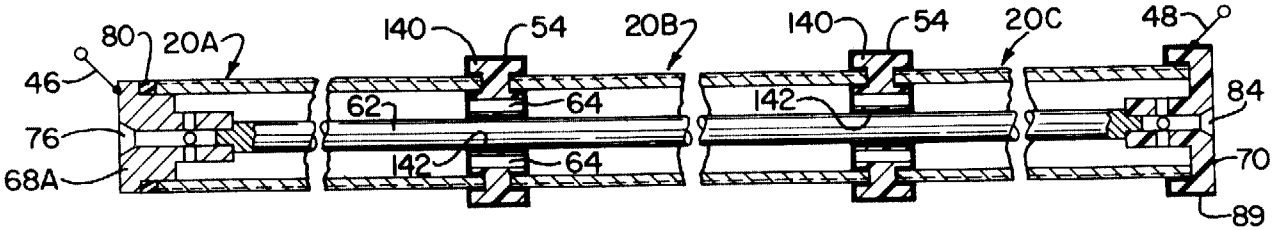
FIG. 9
FIG. 11
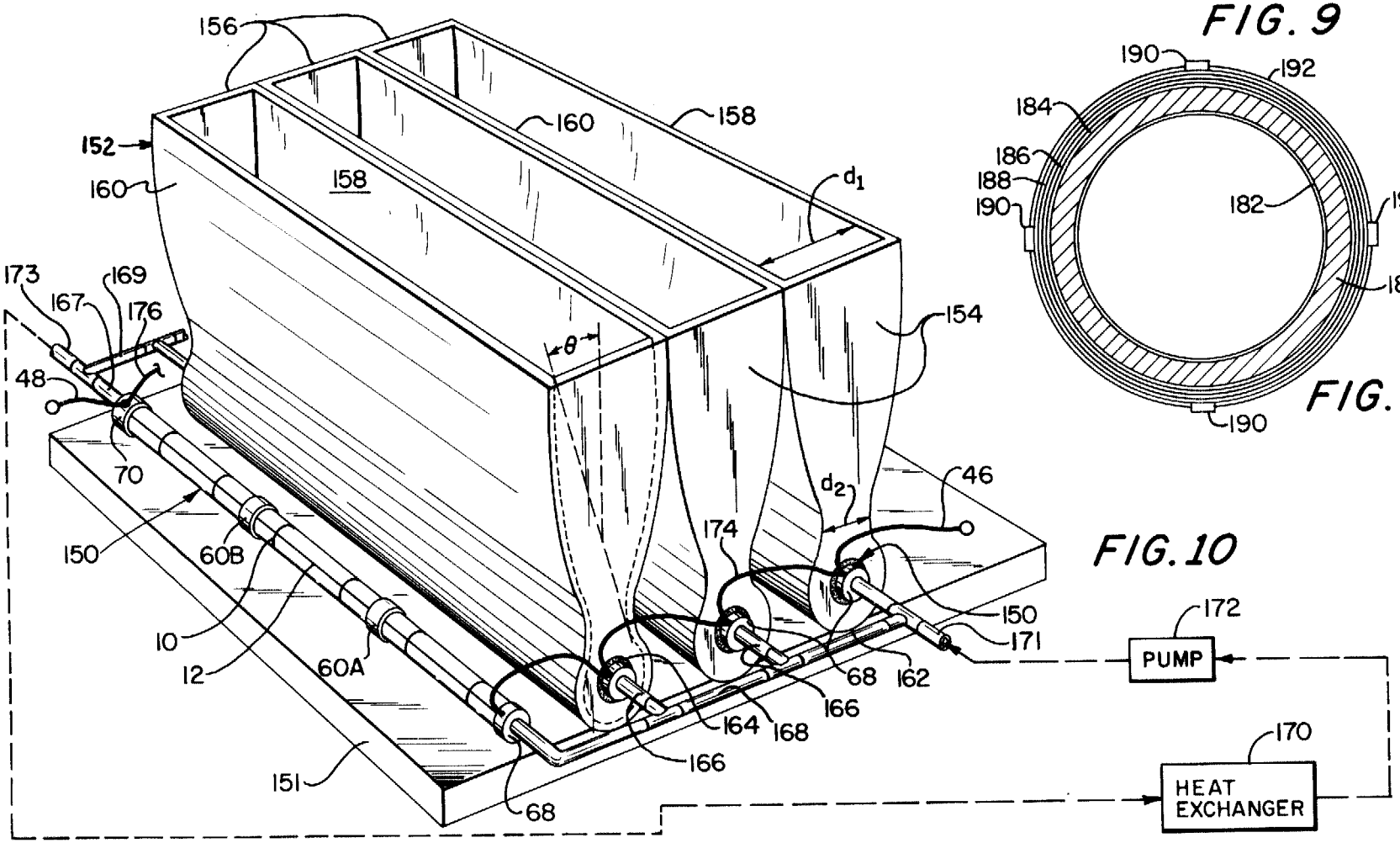
FIG. 10

TUBULAR SOLAR CELL DEVICES

Matter enclosed in heavy brackets [ ] appears in the original patent but forms no part of this reissue specification; matter printed in italics indicates the additions made by reissue.

This invention relates to apparatus for converting solar energy into electrical energy and more particularly to improved solar cells and solar cell arrays.

PRIOR ART

It is well known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Accordingly, it is presently common practice to provide an array of solar cells to generate electrical energy from solar radiation. Most solar cells are made of silicon but cells made of other materials, e.g., cadmium sulfide and gallium arsenide, have also been developed and tested. Silicon is a favored material since it has a band gap of approximately 1.1 electron volts and thus responds quite favorably to electromagnetic energy having a wavelength in the visible and ultraviolet regions of the spectrum.

At the state of the art prior to this invention, solar cells are most commonly fabricated as separate physical entities with light gathering surface areas in the order of 4–6 $cm^2$. For this reason it is standard practice for power generating applications to mount the cells in a flat array on a supporting substrate or panel so that their light gathering surfaces provide an approximation of a single large light gathering surface. Also since each cell itself generates only a small amount of power (a silicon solar cell has an open circuit voltage of about 0.52 volt), the required voltage and/or current is realized by interconnecting the cells of the array in a series and/or parallel matrix.

Another method is to fabricate integrated solar cell panels wherein one region of semiconductivity of each cell is formed by a portion of a continuous body of semiconductor material. Such integrated panels may be used singly but more commonly are connected in series to obtain the desired current.

A number of problems have been encountered in the manufacture of solar cell panels using individual solar cells. Among the more significant problems and limitations are relatively low packing density due to consumption of space by cell interconnections, poor current collecting efficiency, heating up of the cells due to absorption of radiation of wavelengths greater than about 1.1 micron, energy loss due to reflection of incident solar radiation from the light gathering surfaces of the solar cells, eclipsing of portions of the cells by the cell interconnecting means, physical damage to cells and cell interconnections due to thermal cycling or physical stress, and high cost of manufacture. Some of the approaches proposed to overcome such problems are set forth, for example in U.S. Pat. Nos. 3,359,137, 3,575,721, 3,116,171, 3,150,999, 3,778,312, 3,502,507, 3,489,615, 3,378,407, 3,819,417, 3,546,542, 3,811,954, 3,457,427, 3,459.597, 3,411,050, 3,175,929, 3,361,594, 3,615,853, 3,682,708, 3,089,070, and 3,574,925, and the references cited therein. Certain of the foregoing problems are quite more important than others. For example, it is known that the power of a solar cell increases with increasing intensity of the impinging radiation as long as the temperature remains constant, but decreases again with increasing temperature. Also common solders used for interconnections are commonly of the soft variety which cannot withstand elevated temperatures and also tend to absorb infrared radiation which, as is well known, has a heating effect. Hence, it is also essential or at least desirable to provide some means for cooling the solar cells and also to protect the panel from infrared radiation. It also is important to maximize the amount of ultraviolet radiation absorbed by the solar cells so as to maximize their electrical power output. It also is important from the standpoint of providing a reliable power source to have an array which can withstand thermal expansion and contraction and mechanical stress of components. For space application, it also is essential to provide solar panels with a high power-to-weight ratio. The latter is also important if solar cells are to compete with other means of generating electricity for terrestrial use. Although silicon is an abundant material, the cost of silicon in the purity required for cell manufacture is quite high and its production consumes large amounts of electricity. Hence, it is desirable from the standpoint of cost and to reduce resistive losses (which have the effect of decreasing conversion efficiency) to produce solar panels wherein the bulk of the semiconductor material in each cell is minimized.

Unfortunately, certain of the foregoing problems and limitations can be overcome only with difficulty or at relatively great expense.

SUMMARY OF THE INVENTION

Accordingly, a primary object of this invention is to provide a solar cell of new and unique configuration which substantially avoids or overcomes a number of the problems encountered in the manufacture and use of solar cells made according to prior art techniques. A further object is to provide solar cell arrays which comprise a plurality of such cells electrically interconnected in a series and/or parallel matrix. More specific objects of the invention are to provide solar cells and arrays thereof which have a modular form, can be easily cooled, have structural integrity, can be made by existing techniques, and are capable of withstanding changes in dimensions due to thermal cycling. A further object is to provide a solar cell unit wherein current leakage is minimized by the use of a geometry which minimizes the ratio of exposed active surface area to exposed junction region area. Still another object is to provide a solar cell module which can be integrated with a solar thermal system. Yet another object is to provide solar cell modules which can be easily and efficiently interconnected physically and electrically. Another important object is to provide solar cells and solar cell arrays of the type described in combination with radiant energy concentrators for maximizing the intensity of radiation received by such cells and also for distributing the concentration of such radiation.

This invention provides a solar cell which comprises a tubular structure with a P-N junction formed close to its outer light gathering surface. To collect current from the solar cell, a first electrode comprising a grid of conductors is provided on and forms an ohmic contact with the outer surface of the tubular structure, and a second electrode in the form of a layer of conductive material is provided on and forms an ohmic contact with its inner surface. Each tubular structure may comprise one or more photovoltaic cells and a number of such structures may be physically attached end-to-end with appropriate means provided for series and/or parallel electrical connection of cells. Because of the tubular structure, a fluid coolant may be circulated through the interior of each tube so as to provide cooling by direct conduction of heat.

Still other objects of the invention are set forth or rendered obvious by the following detailed description of the invention which should be considered together with the accompanying drawings, wherein like numbers refer to like parts and:

FIG. 9 is a view like FIG. 3 of a parallel-connected array;

FIG. 10 is a perspective view showing several solar cell arrays combined with solar energy concentrators; and FIG. 11 is a cross-section of a Schottky-barrier solar cell.

DESCRIPTION OF THE INVENTION

Figure 1:
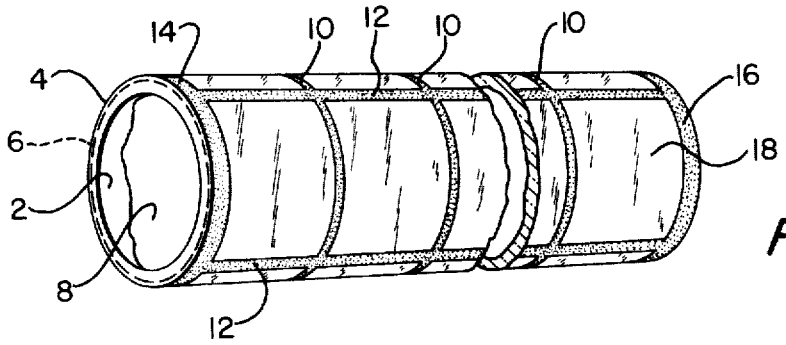
FIG. 1 is a perspective view with a portion broken away of a preferred form of a cylindrical solar cell constructed in accordance with this invention.

The present invention is predicated on the use of semiconductor-grade silicon (or other suitable semiconductor material as hereinafter described) in tubular form. As is already known to persons skilled in the art, silicon and other semiconductor materials may be grown as hollow, i.e., tubular, substantially mono-crystalline bodies with cylindrical, rectangular or other cross-sectional shapes by the processes described and claimed in U.S. Pat. Nos. 3,471,266 and 3,591,348 issued to Harold E. LaBelle, Jr. on 10/7/69 and 7/6/71 respectively (see also U.S. Pat. No. 3,826,625 issued 7/30/74 to J. S. Bailey). By controlling the growth environment and using a high purity melt, it is possible to grown tubular bodies with a purity suitable for semiconductor purposes. Also by introducing suitable conductivity-type-determining impurities, i.e., dopants, to the melt it is possible to produce tubular bodies by the aforesaid processes which have a P- or N-type conductivity and a predetermined resistivity. The addition of a dopant to a melt from which a crystal is grown is conventional, for example, with Czochralski-type processes and also is exemplified by U.S. Pat. Nos. 3,129,061, 3,162,507 and 3,394,994.

In the preferred mode of practicing this invention, a tubular body of one type conductivity is provided initially, and such body is then treated to provide one or more zones of opposite type conductivity so that a P-N junction is created between such zone or zones and the adjacent portion or portions of the hollow body. The zone of opposite type conductivity may be formed in various ways known to persons skilled in the art, e.g., by diffusion or ion implantation of dopants or by epitaxial deposition of opposite type conductivity material. Preferably, the opposite type conductivity zone is formed at the outer surface of the hollow body, preferably by diffusing a suitable dopant into such surface. Thus if the hollow body is a P-type semiconductor, a suitable N-type dopant is diffused into it to create an N-type conductivity zone. Similarly, if the hollow body is an N-type semiconductor, a suitable P-type dopant is diffused into it to create a P-type conductivity zone. The choice of dopant used depends on the material of which the hollow body is composed and also its conductivity type. Thus, for example, boron may be diffused into N-type silicon to produce a zone of P-type conductivity while phosphorus may be diffused into P-type silicon to produce a zone of N-type conductivity. The several types of dopants used for modifying the conductivity of silicon and how such conductivity-modifying impurities may be diffused into a silicon body are well known (see, for example, U.S. Pat. Nos. 3,162,507; 3,811,954; 3,089,070; 3,015,590; and 3,546,542). The types of dopants required to modify the conductivity type of other materials, e.g., gallium arsenide, cadmium telluride, etc., also are well known to persons skilled in the art. In accordance with prior art knowledge, the concentration of dopants in the P and N regions of the tubular structures is controlled to obtain the desired resistivity of the P- and N-type regions. Preferably, the resistivity of such regions is held to less than about 100 ohm-cm and for best conversion efficiency is between about 0.001 to about 10 ohm-cm. In order to improve the efficiency of collecting the photoelectrically produced carriers, the depth of the P-N junction from the outer surface is made small, preferably in the order of ½ micron. After the P-N junction is formed, the hollow body is provided with ohmic contacts or electrodes for its P- and N-type zones whereby the resulting solar cell unit may be connected to an exterior circuit. Additionally, the hollow body may be coated with some sort of anti-reflection or interference film to reduce reflection losses or to block absorption of infrared radiation. In the case of a silicon solar cell for terrestrial use, it is preferred that the hollow body by N-type silicon and the P-type zone be doped with boron and created at its outer surface, since the reflectivity of boron-doped silicon is only about 5% as contrasted with the normal reflectivity of 35% for undoped silicon. In contrast, if an N-type zone is produced by diffusing phosphorus into the outer surface of a P-type silicon body, the reflectivity of that surface will be reduced only a minor amount. However it appears that P on N cells are less resistant to radiation deterioration than N on P cells. Hence, for space applications, it may be preferred to employ N on P cells with an anti-reflection coating or else a P on N cell with an interference film or filter that narrows the wavelength of the incident radiation according to the spectrum of the solar radiations in space and the spectral response of the solar cell.

Referring now to FIG. 1, the illustrated solar cell comprises a cylindrical silicon tube 2 of N-type conductivity which has been subjected to diffusion of boron into its outer surface to form an outer p-conductivity type region 4 and a P-N junction 6. The inner surface of the cylindrical tube is provided with a first electrode in the form of an adherent metal conductive film 8 which forms an ohmic contact with the tube. The film 8 covers the entire inner surface of the tube and consists of a selected metal or metal alloy having relatively high conductivity, e.g., gold, nickel, aluminum, copper or the like, as disclosed in U.S. Pat. Nos. 2,984,775, 3,046,324 and 3,005,862. The outer surface is provided with a second electrode in the form of a grid consisting of a plurality of circumferentially extending conductors 10 which are connected together by one or more longitudinally-extending conductors 12. The opposite ends of the outer surface of the hollow tube are provided with two circumferentially-extending terminal conductors 14 and 16 which intercept the longitudinally-extending conductors 12. The spacing of the circumferentially-extending conductors 10 and the longitudinally-extending conductors 12 is such as to leave relatively large areas 18 of the outer surface of the tube exposed to solar radiation. Preferably, but not necessarily, the conductors 12, 14 and 16 are made wider than the circumferentially-extending conductors 10 since they carry a greater current than any of the latter. These conductors are made of an adherent metal film like the inner electrode 8 and form ohmic contacts with the outer surface of the tube. The several conductors 10, 12, 14 and 16 and the film 8 may be applied by any of several suitable techniques well known in the art, e.g., by evaporation deposition.

As is obvious to a person skilled in the art, the unit of FIG. 1 constitutes a discrete photovoltaic solar cell. When the unit is connected by its inner and outer electrodes into an exterior circuit and the exposed portions 18 of the outer surface of the unit are exposed to solar radiation, electron-hole pairs are generated in the tube with the result that current will flow through the exterior circuit via the inner and outer electrodes. The open circuit potential of the unit is approximately 0.52 volt. The same results will be produced if the solar cell unit is made by providing a tube made of P-type conductivity and treating its outer surface to provide regions of N-type conductivity with an intervening P-N junction.

A plurality of P on N or N on P units as shown in FIG. 1 may be combined to form a solar cell array, with the individual solar cells being interconnected electrically either in series or in parallel according to the output voltage and the output current desired. Preferably, but not necessarily, the several units are mechanically connected end-to-end to form an integrated structure.

Figure 2:
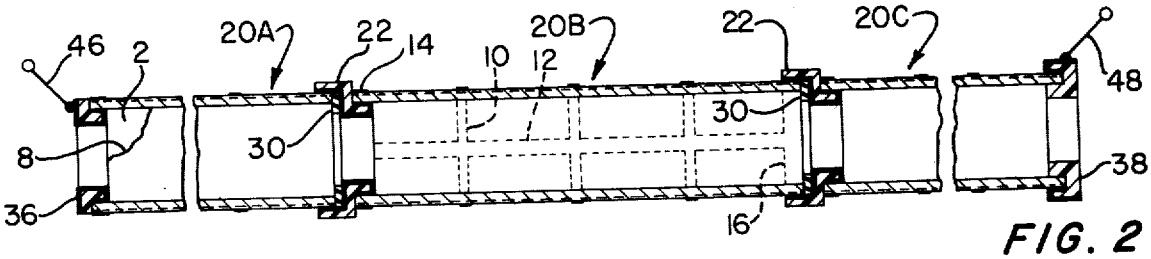
FIG. 2 is a longitudinal sectional view of an array of photo cells of the type shown in FIG. 1.
Figures 2A, 2B, 2C:
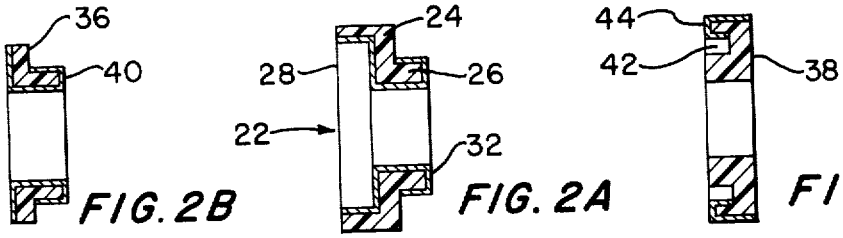
FIGS. 2A, 2B and 2C are enlarged sectional views of certain components of the array of FIG. 2.

FIG. 2 illustrates a solar cell array comprising three of the units shown in FIG. 1 interconnected electrically in series with one another. As seen in FIG. 2, the three units are disposed end-to-end with the central unit 20B mechanically coupled to the two end units 20A and 20B by means of two like coupling members 22 which preferably are made of an electrically insulating material such as plastic, but also may be made of an electrically conducting material which is provided with an insulating coating. As seen best in FIG. 2A, the coupling members 22 are made of electrically insulating material and comprise an annular portion 24 formed with cylindrical flanges 26 and 28 at its inner and outer edges respectively. The inner flange extends within and engages the inner surface of one solar cell unit while the outer flange surrounds and engages the outer surface of the adjacent solar cell unit. Interposed between the annular portion of the coupling member and the solar unit which is surrounded by the outer flange 28 is a ring 30 which also is made of insulating material and has a width in its radial direction which is sufficient to span the entire end surface of the solar unit which it engages, thereby preventing short circuiting across the P-N junction of the solar unit. Each of the coupling members is provided with a plating 32 of conductive material on the inner surface of its outer flange, the adjacent surface of its annular portion, and the inner, end and outer surfaces of its inner flange. The inner and outer flanges of each coupling member make a tight fit with the two solar cell units between which it is disposed, with the result that a direct ohmic contact is made between the outer conductor 16 of unit 20A and the inner electrode 8 of unit 20B, and similarly between the outer conductor 16 of unit 20B and the inner electrode of unit 20C. A first end member 36 is attached to the free end of unit 20A and another end member 38 is attached to the free end of the third unit 20C. As seen in FIG. 2B, end member 36 comprises a circular ring portion which engages the end surface of unit 2A and a cylindrical ring portion which engages the inner surface of the same unit. End member 36 is provided with a conductive metal coating 40 on the exposed annular end surface of its ring portion and also on the inner, end and outer surfaces of its flange portion. The opposite end member 38 is formed as a cylindrical sleeve with a circular groove 42 in one end to receive the free end of the third solar cell unit 20C. The outer surface of this end member is provided with a conductive metal coating 44 which extends around the outer part of its inner end surface and along the outer side of groove 42, as shown in FIG. 2C. End members 36 and 38 make a tight fit with solar cell units 20A and 20C so that their conductive metal layers 40 and 44 make direct ohmic contacts with the inner electrode of unit 2A and the outer conductor 16 of unit 20C.

The above-described array is coupled to an exterior circuit (not shown) by means of terminal leads 46 and 48 which are conductively secured to the conductive coatings on end members 36 and 38. As will be obvious to a person skilled in the art, the terminal lead 46 is connected to the N side of unit 20A while the other conductive lead 48 is connected to the P side of unit 20C. Furthermore, the P side of unit 20A is electrically connected to the N side of unit 20B, while the P side of unit 20B is connected to the N side of unit 20C. As a consequence, the three units are connected electrically in series with the result that the open circuit voltage of the array is equal to the sum of the voltages generated by the three solar cell units, i.e. about 1.56 volts.

Figure 3:
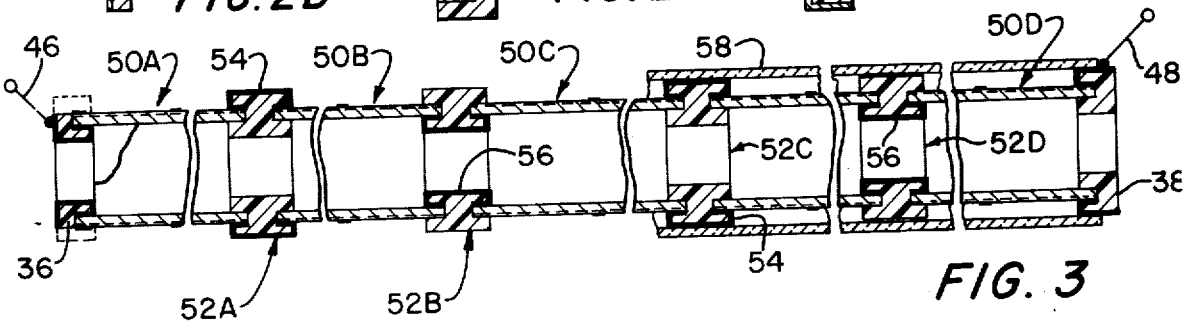
FIG. 3 is a longitudinal sectional view of a second form of solar cell array.
Figure 4:
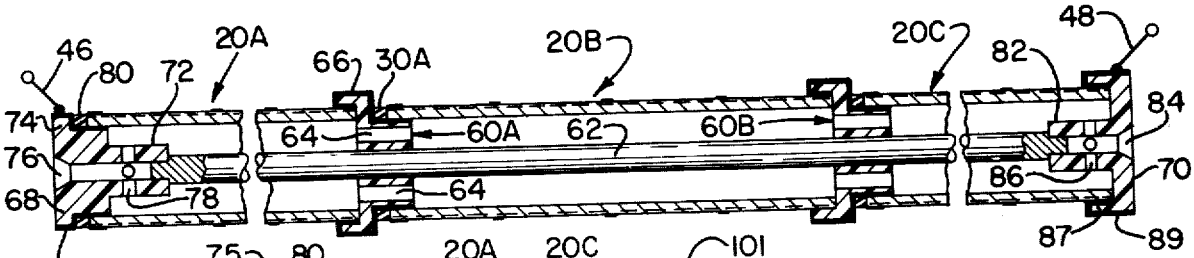
FIG. 4 is a view similar to FIG. 3 of a solar cell array with a central support.
Figure 4A:
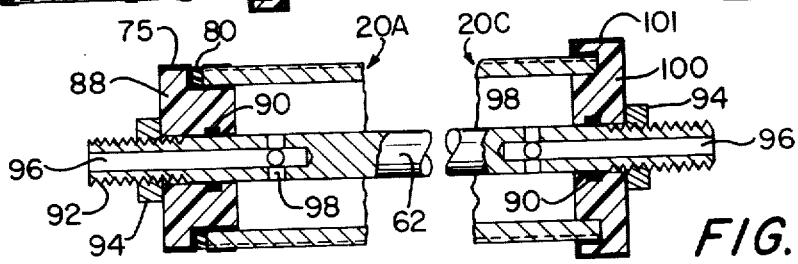
FIG. 4A is a fragmentary sectional view showing an alternative form of solar cell array with a cylindrical mandrel support.

The three units 20A–20C of FIG. 2 may be held fixed in end-to-end relation in several ways. One way is to connect the coupling members 22, 36 and 38 to the solar cell units by means of a conductive cement located where electrical coupling is desired. Another approach is to encircle the coupling members and the ends of tubes 2 with mechanical clamping rings, e.g., split rings with screw means for drawing the ends of the rings together so as to radially compress the tubes and coupling members together. Still another method is to provide means for axially compressing the tubes together. A fourth approach is to force fit the coupling members to the hollow tubes. Still other techniques obvious to persons skilled in the art may be used to hold the assembled solar cell units together so as to form an integrated structure. Preferably the mode of holding a number of tubular solar cell units assembled end-to-end so as to form a sturdy structure in such as to permit a coolant to be circulated through the interior of the units. Three such modes are illustrated in FIGS. 3, 4 and 4A. FIG. 3 also illustrates how P on N and N on P cells may be combined in one array.

Turning now to FIG. 3, there is shown an array of tubular solar cell units 50A, B, C and D which are like the solar cell units of FIG. 2 except that units 50B and 50D are N on P cells whereas units 50A and 50C are P on N cells. Thus, units 50A and 50C are like the solar cell unit of FIG. 1 while unit 50B comprises a tube of P-type silicon with the outer surface treated to provide a cylindrical N-type region separated from the interior portion of the tube by a P-N junction which is the reverse of the junction 6. The end cells 50A and 50D are provided with end members 36 and 38 as described above while four coupling members 52A–D are located between the mutually confronting ends of successive tubes. Coupling members 52 are made of electrically insulating material and are in the form of cylindrical sleeves with a groove in each end face to accommodate a tube end. Coupling members 52A and C are provided with a conductive metal coating (represented by the heavy line 54) in FIG. 3 which covers its outer surface and extends around the outer portion of each of its end edges and along the outer side of each of its end grooves. Thus the end conductors 16 and 14 of units 50A and 50B and the corresponding conductors of units 50C and 50D engage and make a direct ohmic contact with the conductive coating 54 on coupling members 52A and C. Coupling members 52B and 52D are like members 52A and 52C except that each is provided with a conductive metal coating (represented by heavy line 56) which covers its inner surface and extends around the inner portion of each of its end edges and along the inner side of each of its end grooves. Thus, the inner electrodes 8 of units 50B and 50C engage and make an ohmic contact with the conductive coating on coupling member 52B and a similar contact is made by the conductive coating on coupling member 52D with the inner electrodes of units 50C and 50D. As a consequence, the several P-N junctions are connected in series so that the open circuit potential of the array is the sum of the open circuit potentials of the individual cells. The several solar cell units 50A–50 may be secured together in the same manner as the units of FIG. 2 and may be cooled by passing a suitable fluid through the several units via the openings provided by members 36, 38 and 52A–D.

FIG. 3 also illustrates how a radiation filter may be combined with a solar cell or solar cell array constructed in accordance with this invention. In this case, the radiation filter is formed as a cylindrical tube 58 which is slipped over the several units and is secured, e.g., by mechanical means or by bonding with a suitable cement, to at least the two end members 36 and 38 so as to hold the array together. For this modification the end member 36 is modified as shown in dotted lines so as to provide a surface for engaging tube 58. As an optional feature, the filter tube 58 may also be secured to the coupling members 52. The tube 58 is made of a suitable material, e.g., a selected glass, which is transparent to radiation with a wavelength which will produce electron-hole pairs and thereby produce the desired photovoltaic effect but will pass little or no infrared radiation. Thus, in the case of silicon, the filter is made preferably of a material which will block radiation of wavelengths greater than about 1.2 microns.

FIG. 4 shows a solar cell array like that of FIG. 2 wherein the several units are mounted on a central support. In this case, three like units 20A–C are separated by coupling members 60A and 60B which are similar to coupling members 22 except that their inner diameters are sized so that they make a snug sliding fit with a center support rod or mandrel 62. Additionally, each of the coupling members 60 is provided with one or more apertures 64 so as to permit a coolant to pass from the interior of one solar cell unit to the next solar cell unit. The coupling members 60 may be plated like the coupling members 22, in which case insulating spacer rings like those shown at 30 in FIG. 2 may be introduced between each coupling member and the adjacent solar cell unit which is embraced by the outer flange of the coupling member. Alternatively, the coupling members may be plated with a conductive metal film which covers the inner, end and outer surfaces of the outer flange and extends to and covers the outer surface of the inner flange, as represented by the heavy line 66 in FIG. 4. In such case, a circular spacer 30A made of electrical insulating material is interposed between each coupling member and the solar cell unit which fits over the inner flange of the coupling member so as to prevent short circuiting of the P/N junction by the metal film 66. In this way, each coupling member provides an ohmic connection between the end conductor 16 of one unit and the inner electrode 8 of the adjacent unit. The opposite ends of the array are fitted with end members 68 and 70. The end member 68 is essentially a cylindrical plug with a reduced diameter axial extension 72 at one end and a peripheral flange 74 at the other end. The circumferential surface of the flange 74 is coated with a conductive metal film represented by heavy line 75 which extends to and covers the circumferential surface of that portion of the plug which fits within the unit 20A, whereby an ohmic contact is made to the inner electrode 8 of that unit. The end member 68 is provided with an axial bore 76 and one end of the center support 62 is provided with a reduced diameter section which fits within the inner end of bore 76. Additionally, the member 68 is provided with one or more radially-extending passageways 78 which intersect the axial bore 76. A non-conductive spacer 80 is interposed between the flange 74 of end member 68 and the adjacent end surface of unit 20A, so as to prevent short circuiting of the P/N junction. The member 68 is secured in place by bonding it and the spacer 80 to the unit 20A and/or by bonding its extension 72 to the central support 62. The opposite end member 70 is also formed with an axial extension 82 and a central bore 84. One or more radially-extending ports 86 are provided which intersect bore 84, and the adjacent end of center support 62 has a reduced diameter section which fits within the axial bore 84. The end member 70 is formed with a cylindrical flange 87 which is sized to fit over and engage the adjacent end of unit 20C. The inner surface of the flange of end member 70 is coated with a conductive metal film represented by heavy line 89 which extends around the edge surface of that flange and covers the cylindrical outer surface of the same flange, whereby an ohmic contact is made to the end conductor 16 of unit 20C. End member 70 is bonded to the unit 20C and/or to the center support 62. As a result, the several units and the center support 62 form an integrated structure. Terminal leads 46 and 48 may be coupled to the conductive metal films on end members 68 and 70 as shown, whereby the illustrated array may be connected onto an exterior circuit (not shown). The above-described array offers the advantage that the end members 68 and 70 not only are used to form a sturdy mechanical assembly but also function as means for circulating a coolant fluid through the interior of the array. A coolant may be introduced, for example, through the axial bore 76 and radial ports 78 and removed via radial ports 86 and axial bore 84, with the coolant passing from one unit to the other via the passageways 64 of coupling members 60A and B.

FIG. 4A shows a further modification of the invention. In this case, the center support 62 extends through an end member 88 which is similar to end member 68 except that it lacks the reduced diameter extension 72. An O-type seal 90 is located in a groove surrounding the axial bore in end member 88 and tightly engages the central support 62. The outer end of the center support 62 is threaded as shown at 92 to receive a nut 94 which cooperates with the central support to urge the end member 88 against it in a direction to compress the spacer 80 between it and the end of the solar cell unit 20A. The central support 62 is provided with a blind axial bore 96 and one or more radial ports 98 which intersect bore 96. At the opposite end of the array, an end member 100 is employed which is similar to end member 38 and has a conductive coating 101 like coating 44. A second nut 94 at the adjacent end of support 62 urges end member 100 against the end of solar cell unit 20C. Hence, the several solar cell units are held together by the axial compression exerted on end members 88 and 100 by coaction of nuts 94 and center support 62. A coolant may be introduced into one end of the array via axial bore 96 and ports 98 and is withdrawn from the other end of the array by the corresponding ports and axial bore in the opposite end of center support 62. The use of a center support 62 with end members as shown in FIGS. 4 and 4A is advantageous regardless of whether the solar cell array comprises P on N or N on P cells or a combination of P on N and N on P cells.

Figure 5:
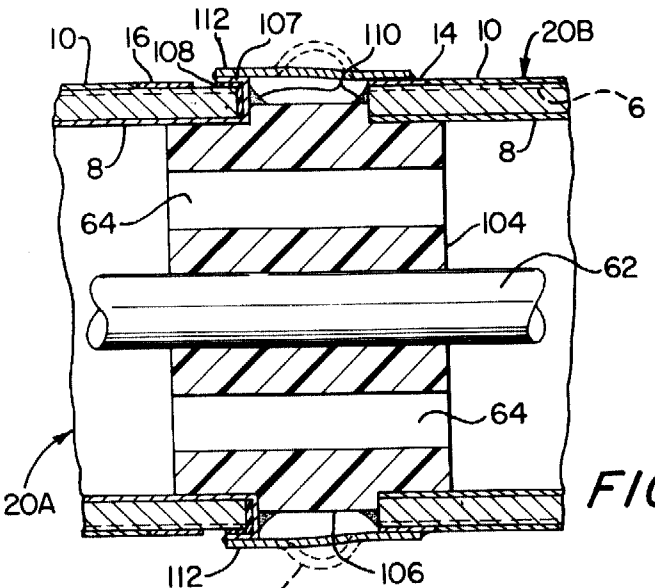

FIG. 5 shows one alternative method of electrically and mechanically coupling together two solar cell units of the type shown in FIG. 1. In this case a non-conductive coupling member 104 is employed which is in the form of a cylindrical annulus having an inner diameter sized to make a close sliding fit with the center support 62. The coupling member 104 is provided with passageways 64 as shown for permitting a coolant to flow from one solar cell unit to the other. The outer surface of the coupling member 104 is provided with a rib 106 which fits between and forms two oppositely disposed shoulders for engaging the two solar cell units. In this case each of the solar cell units 20A and 20B is modified so that at one end its inner electrode 8 terminates a short distance from its end edge, while at the other end the metal film which forms the electrode is extended around the end edge and up over the outer surface of the hollow tube so as to form a tab as shown at 107. However, between the extended portion of the inner electrode 8 and the end and outer surfaces of the tube 2, a thin layer of insulating material 108 is provided so as to prevent short circuiting of the P/N junction. By way of example, if the tubes of solar cell units 20A and 20B are made of silicon, the insulating material 108 may be a film or layer of silicon dioxide ($SiO_2$). In this case also, the end conductor 16 is spaced from the end edge of the tube 16 so that a gap exists between it and the extended portion 107 of the inner electrode. The adjacent ends of the two tubes are fitted over the coupling member 104 so that they abut the shoulders formed by its rib 106, and a suitable non-conductive cement or adhesive may be applied between the rib and the adjacent end surfaces of the two tubes as shown at 110 so as to bond the two tubes to the coupling member 104. Thereafter, a direct electrical connection is made between the inner electrode 8 of the tube 20A and the other conductor 14 of unit 20B by means of one or more conductive straps 112 which are secured to tab 107 of unit 20A and conductor 14 of unit 20B by soldering or by a conductive cement or by other suitable means known to persons skilled in the art. To allow for expansion and contraction due to temperature variations, the cement 110 may be omitted and the conductive strap 112 may be formed with a bowed portion as shown in phantom at 114, whereby endwise movement of one tube relative to coupling member 104 and the other tube may be compensated for by flexing of the bowed portion 114.

Figure 6:
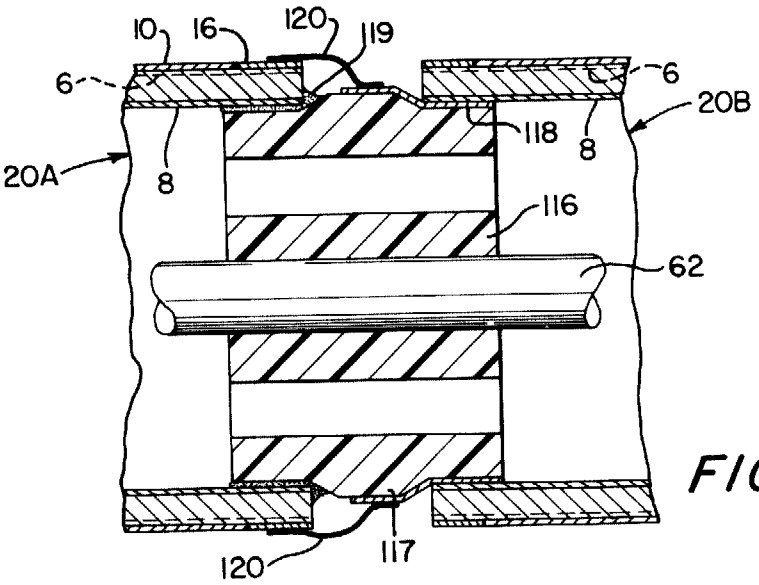
FIGS. 5–8 are fragmentary sectional views on an enlarged scale showing different methods of interconnecting tubular solar cells in an array.

FIG. 6 shows still another way of providing electrical connections between two adjacent tubular units. In this case the coupling member 116 is similar to coupling member 104 except that its outer rib 117 is bevelled as shown. The outer surface of coupling member 116 is provided with a coating of a conductive metal as shown at 118 which is soldered to and makes an ohmic contact with the inner electrode 8 of the unit 20B. The other unit 20A has its inner surface bonded to coupling member 116 by a non-conductive cement as shown at 119. The end conductor 16 of unit 20A is coupled to the metal film 118 on coupling member 116 by one or more flexible conductive wire straps 120. If desired, the straps 120 may be replaced by a flexible conductive cylinder with one large enough to surround and engage the end conductor 16 of unit 20A and the other end small enough to surround coupling member 116 and be conductively bonded to the metal film 118.

Figure 7:
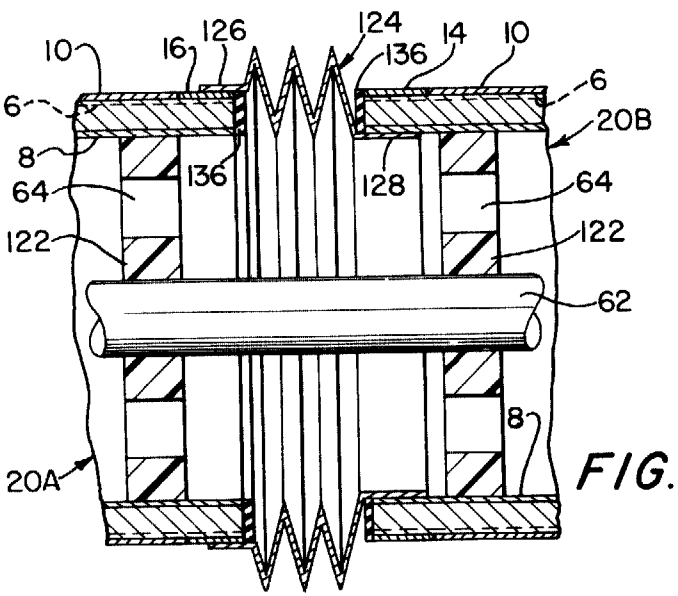

FIG. 7 shows an arrangement wherein the central support 62 extends through spacer elements 122 which are similar to coupling members 104 and 116 except that they do not extend between two solar cell units. Preferably, but not necessarily, the spacer elements 122 are bonded to units 20A and 20B and preferably are sized to make a close but sliding fit with center support 62. Spacers 122 are provided with passageways 64 to permit flow of coolant as previously described. Interposed between and connecting the two solar cell units is an accordian-type bellows 124. One end of the bellows has a cylindrical extension 126 which fits over and is bonded to the end conductor 16 of unit 20A. The other end of the bellows has a cylindrical extension 128 which fits within and is bonded to the inner electrode 8 of unit 20B. Preferably, bellows 124 is made entirely of a conductive metal or metal alloy; alternatively, it may be made of a non-conductive material but plated with a conductive metal so that a direct electrical connection is made between the conductor 16 of unit 20A and the inner electrode 8 of unit 20B. The cylindrical portions 126 and 128 are preferably soldered but may be bonded by a conductive cement to units 20A and 20B so that a good ohmic contact is assured.

This modification offers the advantage that the bellows 124 allows one or both of the coupled units 20A and 20B to shift lengthwise to compensate for shock or temperature-induced expansion or contraction without rupturing the connections between the coupled unit.

Figure 8:
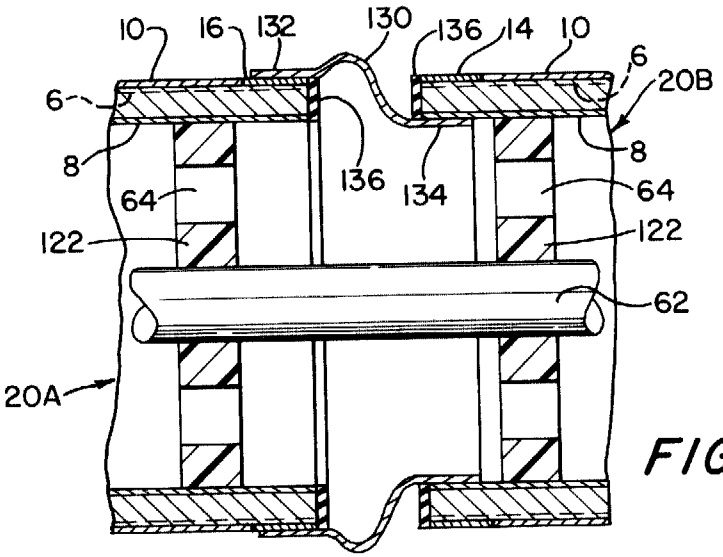

FIG. 8 shows a modification of the invention which is like that of FIG. 7 except that the bellows 124 is replaced with a bowed flexible sleeve 130 which has a cylindrical end section 132 which is bonded to end conductor 16 of unit 20A and a smaller cylindrical end section 134 which is bonded to the inner electrode 8 of unit 20B. The sleeve 130 may be made of a conductive material or of an insulating material with conductive surface coatings so as to provide a direct electrical path between end conductor 16 of unit 20A and inner electrode 8 of unit 20B. If desired, insulating spacers 136 may be bonded to the confronting end surfaces of units 20A and 20B as shown in FIGS. 7 and 8 so as to prevent portions of the bellows 124 and sleeve 130 from making electrical contact with those end surfaces; in this way short circuiting of the P/N junctions by the elements 124 and 130 is avoided in the event the units 20A and 20B are moved toward one another. The embodiments of FIGS. 7 and 8 offer the advantage that the units 20A and 20B are free to move lengthwise of the central support 62 to a limited extent, thereby preventing rupture of the electrical connections between them when the units are subjected to shock or vibrations or when they contract or expand due to changes in temperature. The different ways of coupling together adjacent solar cell units shown in FIGS. 5–8 may be employed in arrays where the opposite ends of the center support 62 are connected to end members as shown in FIGS. 4 and 4A, or otherwise.

A further advantage of the use of center support 62 is that it may be used as a common conductor or bus for the inner electrodes 8 of several solar cell units where it is desired to electrically connect the several units in parallel. Thus, as shown in FIG. 9, three tubular solar cell units 20A–20C are connected end-to-end by means of coupling members 140 which are shaped generally like the coupling elements 52A and C of FIG. 3 and have corresponding conductive coatings 54. However, the inner diameters of coupling member 140 are sized so that their inner surfaces tightly grip center support 62, and passageways 64 are provided to allow a coolant to be passed through the several units. Additionally, the inner surface of each coupling member is coated with a conductive metal film which, as represented by the heavy line 142, extends around the inner portions of its opposite end surfaces and along the inner sides of its two grooves. The metal films 54 are bonded to the end conductor 16 of one unit and the opposite end conductor 14 of the adjacent unit, while the metal films 142 are bonded to the inner electrodes 8 of the corresponding units and tightly grip the center support 62. The latter is made of an electrically conductive material or else has an electrically conductive coating so that it will serve to electrically connect the inner electrodes 8 of the three units to end member 68A. The latter is like end member 68 except that it is made of a conductive material. End member 70 is made the same as the correspondingly numbered element in FIG. 4. Terminal leads 46 and 48 are bonded to the end member 68 and the conductive metal film 89 of member 70 respectively. As a consequence, the three cells are connected in parallel with one another so that when the array is connected to an exterior circuit, the total current output will be the sum of the currents generated by the individual solar cell units.

FIG. 10 illustrates how tubular solar cells as provided by the present invention may be combined with solar energy concentrators, the solar cells acting as energy receivers. The embodiments of FIG. 10 comprises four solar cell arrays or batteries 150 like the one shown in FIG. 4 and, for convenience of illustration, only three of the arrays are combined with concentrators. Each concentrator 152 is affixed to a support plate 151 and comprises flat opposite end walls 154 and 156, opposite side walls 158 and 160 which are parabolically curved in cross-section, and a bottom wall 162 which is circularly curved in cross-section. The open upper end of each concentrator forms and entrance pupil with a width $d_1$.

Each concentrator is made so that the inner surfaces of its end, side and bottom walls are capable of functioning as reflectors of solar radiation. Thus, for example, each concentrator may be made of sheet metal with a mirror surface, e.g. aluminum, or may be made of a plastic with a reflective metal film deposited on its inner surfaces. The junction of the side walls 153 and 160 with bottom wall 162 forms an exit pupil with a width $d_2$. The curved bottom wall 126 forms a chamber to receive the associated solar cell array 150 which is centered in the chamber. The radius of curvature of the bottom wall is great enough to provide a space between it and the associated array which is large enough to permit its inner surface to receive and reflect a substantial portion of whatever radiation passes into the exit pupil. Preferably but not necessarily, the outer diameter of the tubes which form each solar cell array is about one-half of the width $d_2$. Preferably but not necessarily the width of the entrance and exit pupils are set so as to provide a ratio of $d_1d_2$equal to $1/\sin \theta max$, where $\theta max$ is the angle formed between the center axis of the concentrator and a line extending from one edge of the entrance pupil to the opposite edge of the exit pupil. The concentrator accepts radiation (diffused or collimated) over an angle of $2\theta max$ and concentrates it all in the exit pupil. This type of concentrator is described in a preprint of an article by Roland Winston, "Solar Concentrators of a Novel Design", scheduled for publication in the October 1974 issue of Solar Energy Journal. $/d_2$ The opposite ends of each array extend through insulating sleeves 164 mounted in the opposite end walls of the associated concentrator and conduits 166 and 167 are attached to the end members 68 and 70. The conduits 166 and 167 are connected to header pipes 168 and 169 respectively. The latter are connected to conduits 171 and 173 whereby coolant is fed into one end of each array and fed out of the opposite end of each array. The coolant circulating system is preferably of the closed loop type comprising an exterior heat exchanger shown schematically as box 170 and a pump 172 for circulating the coolant through the solar cell arrays and the heat exchanger. With such a circulating system, the coolant absorbs heat from the solar arrays and is relieved of heat in the heat exchanger. For terrestrial installations, the heat exchanger may be replaced by a refrigeration plant or a large reservoir of coolant which is adapted to give up the heat recovered from the solar cells by radiative cooling or by heat exchange with a solid or fluid medium, e.g., stones, water, air, etc.

As an alternative measure, the coolant circulating system may be arranged so that coolant circulates through the several arrays in series instead of in parallel. However, a parallel cooling system as shown in FIG. 10 is preferred since it enables all of the arrays to be maintained at substantially the same temperature.

Still referring to FIG. 10, the three cells in each array are connected in series in the manner shown in FIG. 4, but the four arrays are connected in parallel, whereby a series parallel matrix is formed. The parallel connections are provided by (a) connecting together the coupling members 68 with conductive straps 174 which are bonded to and make ohmic contacts with the metal films 75 of the coupling members, and (b) connecting together the coupling members 70 with conductive straps 176 which are similarly secured to the metal films 89. Terminal leads 46 and 48, similarly connected to one of the coupling members 68 and 70, are provided to connect the solar cell matrix to an exterior circuit. The latter may comprise a power consuming load such as, for example, a d.c. motor, an electric heater or electric lights, or a power storage means such as a rechargeable storage battery. In the embodiment of FIG. 10, some of the solar radiation entering the entrance pupil of a concentrator may pass directly through the exit pupil and be received by the associated solar cells either directly or after reflection from the bottom wall 162. The remainder of the radiation entering the entrance pupil is reflected by the end or side walls of the concentrator into the exit pupil where it strikes the solar cells either directly or after reflection from bottom wall 162. The latter wall functions to direct radiation onto the bottom half of the solar cell array so that each solar cell is irradiated substantially uniformly over its entire circumference. This has the dual effect of maximizing the current output and avoiding local hot spots. Simultaneously, the circulating coolant removes any heat generated in the solar cells by absorption of infrared radiation or by resistive losses, whereby the solar cell arrays are maintained at an even temperature. The coolant employed and the rate at which it is circulated are selected so as to maintain the solar cells at a temperature which will enable the cells to operate with a satisfactory conversion efficiency. Also the coolant must be a non-conductor of electricity since otherwise it might cause short-circuiting of the cells. By way of example but not limitation, the coolant may be de-ionized water, fluorinated hydrocarbon, a silicone oil, Freon, air or nitrogen.

It is to be understood that the tubular solar cells and arrays may be combined with other forms of solar energy concentrators. Thus the concentrator may take the form of a simple trough-like reflector which has a parabolic cross-section, with a tubular solar cell or reflector extending lengthwise of the trough substantially coaxially with the focus of the parabola. Furthermore, a transparent cover may be mounted over the concentrator(s) to provide protection from rain, dust, etc.

While the invention as herein described preferably takes the forms of silicon P-N junction solar cells, it is not limited to devices made of silicon or to devices with homo-junctions. Instead the tubular cells may be made of other semiconductor materials and comprise a hetero-junction or a surface barrier junction (e.g., a Schottky-barrier) in place of a homo-junction. Furthermore, the semiconductor material need not be substantially monocrystalline since photovoltaic devices are known which comprise polycrystalline semiconductor materials, e.g., cadmium telluride. Thus, for example, tubular solar cells may be made which essentially comprise gallium arsenide P-N junctions, gallium arsenide phosphide P-N junctions, [cadimium] *cadmium* telluride P-N junctions, cadmium/sulfide/copper sulfide and gallium arsenide/gallium phosphide hetero-junctions. Similarly, for example, the tubular solar cells may be surface barrier devices which comprise metal or metal oxide/semiconductor junctions, e.g., solar cells using gold on N-type silicon, aluminum on P-type silicon, tin oxide on N-type silicon, chromium on P-type silicon, and indium oxide on cadmium telluride. The aforesaid P-N and hetero-junctions may be made by providing a tubular body of one junction material and forming a layer of the other junction material at or on the inner or outer surface of such body by methods well known in the art, e.g., by diffusing an opposite-conductivity-type dopant into the outer surface in the case of a homo-junction or epitaxially growing a thin layer of the other junction material on the outer surface of the tubular body in the case of a hetero-junction. Similarly, solar cells with surface barrier junctions may be made by depositing a metal or metal oxide barrier material on the outer surface of a tubular semiconductor body by vacuum deposition, sputtering, [electorless] *electroless* plating or other suitable technique. An essential requirement of the barrier material is that it have a suitable optical transmission capability so that the device will exhibit a photovoltaic behavior.

FIG. 11 illustrates a cross-section of a tubular Schottky-barrier solar cell which comprises a tubular body 180 of P-type silicon, an aluminium ohmic contact layer 182 on its inner surface, and a layered Schottky barrier on its outer surface which is made according to the teachings of W. A. Anderson et al., An 8% Efficient Layered Schottky-Barrier Solar Cell, Journal of Applied Physics, Vol. 45, No. 9, pp. 3913–3915, September 1974. The layered barrier consists of a chromium barrier layer 184, a copper conductive layer 186, a chromium oxidation layer 188 over the copper layer, an aluminum ohmic contact or current collector 190, and a silicon monoxide anti-reflection coating 192. The ohmic contact is represented as several discrete sections since it is fabricated as a grid, preferably a grid with sections corresponding to conductors 10, 12 and 14 and 16 of the cell unit shown in FIG. 1, whereby a plurality of relatively large areas of the chromium barrier layer 184 (corresponding to areas 18 of FIG. 1) are exposed for stimulation by solar radiation. The silicon monoxide [laayer] *layer* is applied over the copper layer in the spaces between the discrete sections of the grid-like outer contact 190. Preferably the ohmic contact 182 covers most if not all of the inner surface of the silicon body and has a thickness of about 1 micron or less. The thickness of chromium layer 184, copper layer 186, chromium oxidation layer 188, ohmic contact 190 and the SiO coating 192 are preferably made with thicknesses of 44A°, 58A°, 23A°, 1000A°, and 690A° respectively.

Obviously, a plurality of tubular hetero-junction and surface barrier junction solar cells may be arranged to form arrays and be combined with concentrators in the various ways illustrated in FIGS. 2–10.

It is to be appreciated also that the tubular solar cells need not be cylindrical, but instead, for example, they may have an elliptical, square, rectangular, or other cross-sectional configuration. The essential requirement of the invention is that the solar cell unit comprise a tubular semiconductor body adapted to exhibit a photovoltaic behavior. In this connection, it is to be noted further that the term "photovoltaic semiconductor barrier device" is intended to encompass devices which have a homo-junction, a hetero-junction, or a surface barrier junction, and also that the term "surface barrier junction" includes metal/semiconductor barrier devices and metal oxide/semiconductor barrier devices, and notably Schottky barrier devices.

The following specific example illustrates a preferred mode of practicing the invention.

EXAMPLE

A cylindrical substantially monocrystalline P-type silicon tube is grown according to the method described in U.S. Pat. No. 3,591,348. The tube is made with a length of about 6 inches, an outside diameter of 0.50 inch and wall thickness of about 0.01 inch. The interior surface is plated with a 0.001 inch layer of nickel and phosphorus is diffused into the outer surface of the tube to a depth of about 0.5 micron to form an N-type outer region with a distinct P-N junction. Then aluminum is vacuum deposited onto the outer surface of the tube in the form of a grid consisting of a plurality of longitudinally- and circumferentially-extending conductors. The aluminum grid is formed with a thickness of about 4.0 microns. The inner and outer conductors are connected to a measuring circuit and the device irradiated by sunlight. The device exhibits an open circuit voltage of about 0.5 volts and a conversion efficiency of about 10%.

The advantages of the invention are numerous. The tubular structure renders the cell units self-supporting even with tubes of relatively small wall thicknesses (e.g., ½ inch silicon tubes with a wall thickness of 100–200 microns), thereby obviating the need for a supporting tubular substrate. The absence of a supporting substrate reduces weight, cost and also facilitates mechanical and electrical interconnection of two or more cells. Furthermore, the tubular cells may be connected electrically in parallel or in series, and by means of inexpensive reflectors such as a parabolic reflector it is possible to achieve energy concentration ratios of 10 or more. By connecting a plurality of tubular cells in series, it is possible to obtain a high electrical power output at a moderate current level and at a voltage level suitable for charging conventional batteries, thereby obviating the need for heavy conductors on the cells. It is to be appreciated also that to achieve a reasonable voltage output from a photovoltaic array, individual cells must be connected in series. In the case of planar cells, a rectangular heat exchanger is required for cooling purposes if solar concentration is used, but the heat exchanger typically must be electrically insulated from the solar cells. The intervening insulating layer reduces the rate at which heat can be conducted away from the solar cells and also tends to complicate the heat exchanger design. The instant invention facilitates cooling since the coolant is in direct contact with the inner surface of the tubular solar cell. Hence, no auxiliary heat exchanger structure need be mounted immediately adjacent to the solar cell unit. A further advantage is that whatever portion of the received solar energy is absorbed by the solar cells as heat may be recovered by the coolant. Hence, the coolant for the solar cell arrays may advantageously be coupled to solar thermal devices of the type which are designed to heat a fluid by solar energy and to use the heated fluid as a heat supply or, if it is steam, to drive a turbine and thereby an electrical generator. More specifically, the exit coolant from the solar cells may be used as the entry heat absorber for a solar thermal device. As a result of the preheating of the fluid by its transit through the solar cells, less heating is required to be accomplished in the solar thermal device to produce a selected fluid temperature, e.g., 200° F. and therefore, the solar thermal device can be corresponding reduced in size from what it would have to be if the fluid was not preheated in the solar cells.

I claim:

1. A solar cell unit comprising a tubular semiconductor body having an outer radiation-receiving region of a first conductivity type and an inner region of a second opposite conductivity type separated by a P-N or N-P junction, and [electrically conductive contacts] *first and second electrodes respectively carried on opposite sides of said junction* for coupling said outer and inner regions to an external circuit, *said first electrode comprising a plurality of contacts electrically-connected to one another and to said outer radiation-receiving region.*

2. A solar cell unit according to claim 1 wherein said outer and inner regions are substantially concentric with one another.

3. A solar cell unit according to claim 1 wherein said body is generally cylindrical.

4. A solar cell unit according to claim 1 wherein said body has outer and inner surfaces and said contacts are attached to said [surfaces.] *outer surface.*

5. A solar cell unit according to claim 1 wherein said outer and inner regions have P-type and N-type conductivities respectively.

6. A solar cell unit according to claim 1 wherein said outer and inner regions have N-type and P-type conductivities respectively.

7. A solar cell unit according to claim 1 wherein said body is made of silicon.

8. A solar cell unit according to claim 1 further including a radiation filter surrounding and spaced from said outer radiation-receiving region.

9. A solar cell unit according to claim 8 wherein said radiation filter is a self-supporting tubular element, and further including means holding said tubular element fixed with respect to said tubular semiconductor body.

10. A solar cell unit according to claim 1 wherein [one of] said contacts [comprises] *comprise* a grid of *conductively connected* electrical conductors bonded to the outer surface of said body and said outer radiation-receiving region comprises portions of said outer surface between said conductors.

11. A solar cell unit according to claim 10 wherein said grid includes a first conductor at one end of said body and a second conductor at the other end of said body, and at least one other conductor extending between said first and second conductors.

12. A solar cell unit according to claim 1 further including radiation-reflecting means positioned adjacent to said body for directing received radiation onto said radiation-receiving region.

13. A solar cell unit comprising a *self-supporting* tubular electrically semiconductive body having a radiation-receiving outer surface and an inner surface, said body also having annular regions of N-type conductivity and P-type conductivity that are separated by a P-N junction, one of said regions being contiguous with said outer surface and the other of said regions being contiguous with said inner surface, said P-N junction extending generally parallel with and lying close to said outer surface, and contact means *forming a single electrode* on *each of* said outer and inner surfaces *respectively* for coupling said cell to an external circuit, *said electrode on said outer surface comprising a plurality of contacts electrically connected to one another and to said outer surface.*

14. A solar cell unit according to claim 13 [wherin] *wherein* said [contact means] *electrode* on said outer surface comprises a plurality of strips *electrically-con-*

*nected to one another* each *of said strips being* formed of a layer of electrically conductive material bonded to said outer surface.

15. A solar cell unit according to claim 13 wherein said body is made of silicon.

16. A solar cell array comprising a plurality of solar cell units *electrically-connected to one another*, each unit comprising a tubular electrically semiconductive body having an outer radiation-receiving region of one conductivity type and an inner region of another conductivity type separated by a P-N or N-P junction, and [electrically conductive contacts] *first and second electrodes electrically* connected to said outer and inner regions *respectively* of *each of* said bodies for coupling said solar cell units to an exterior circuit, *said first electrode comprising a plurality of contacts electrically-connected to one another and to said outer radiation-receiving region.*

17. A solar cell array according to claim 16 wherein at least some of the [contacts] *electrodes* of said bodies are interconnected so that at least some of said solar cell units are connected electrically in parallel.

18. A solar cell array according to claim 16 wherein at least some of the [contacts] *electrodes* of said bodies are interconnected so that at least some of said solar cell units are connected electrically in series.

19. A solar cell array according to claim 16 further including means for circulating a fluid coolant through said hollow bodies.

20. A solar cell array comprising a plurality of solar cell units, each of said units comprising a hollow electrically semiconductive body having an outer radiation-receiving region of one conductivity type and an inner region of another conductivity type separated by a P-N junction, at least some of said units being disposed so that their hollow bodies are disposed end-to-end, means mechanically interconnecting said end-to-end bodies, and electrically conductive contacts connected to said outer and inner regions of said bodies for coupling said solar cell units to an external circuit.

21. A solar cell array according to claim 20 further including a coupling member disposed between and connecting the end of one body with the adjacent end of another body.

22. A solar cell unit according to claim 21 wherein said coupling member provides an electrical connection between a contact on said one body and a contact on said another body.

23. A solar cell array according to claim 20 wherein said interconnecting means comprises an elongate support member disposed within and extending lengthwise of the bodies of said at least some units, and means extending radially of said support member for preventing movement of the bodies of said at least some units radially of said support member.

24. A solar cell array according to claim 23 wherein said radially extending means has openings to permit a fluid to flow lengthwise within and between the bodies of said at least some units.

25. A solar cell array according to claim 24 wherein said radially extending means are mounted on said support member.

26. A tubular photovoltaic semiconductor barrier device comprising a tubular semiconductor body, a surface on the outer side of said body forming a radiation-receiving region, means forming a photovoltaic junction between said surface and said body, and [ohmic contacts] *first and second electrodes electrically-connected* on *respective* opposite sides of said junction for coupling said device to an external circuit *said first electrode comprising a plurality of ohmic contacts electrically-connected together and to said radiation-receiving region.*

27. A device according to claim 26 wherein said semiconductor body is of a first conductivity type, said means comprises a semiconductor of a second conductivity type, and said photovoltaic junction is a P-N or N-P junction.

28. A device according to claim 26 wherein said means comprises a conductive metal or metal oxide layer and said photovoltaic junction is a surface barrier junction.

29. A device according to claim 26 wherein said body is formed of a first semiconductor, said means comprises a second semiconductor, and said photovoltaic junction is a hetero-junction.

30. A device according to claim 26 wherein said semiconductor body has an inner surface, and [further including a first grid-like electrically-conductive contact] *said ohmic contacts form a grid* attached to the surface on the outer side of said body and [a second] *said second electrode comprises an* electrically-conductive contact attached to the inner surface of said body.

31. A photovoltaic device comprising a tubular semiconductive body having radially spaced outer and inner surfaces, an outer radiation-receiving region of a first conductivity type extending inwardly of said body from said outer surface and an inner region of a second conductivity type material extending radially outward away from said inner surface, with said outer and inner regions forming a rectifying junction which is generally parallel and close to said outer surface and is capable of generating a current in response to radiant energy passing [thorugh] *through* said outer surface into said outer region, and first and second electrodes carried by said body and connected to said outer and inner regions respectively for coupling said device to an external circuit *wherein said first electrode comprises a plurality of contacts electrically-connected to one another and to said outer region.*

32. A device according to claim 31 further including means for circulating a fluid coolant lengthwise through the interior space defined by said inner surface.

33. A photovoltaic device comprising a tubular body which is made of silicon and has an outer radiation-receiving region of a first conductivity type silicon and an inner region of a second conductivity type silicon, with said outer and inner regions forming a semiconductor rectifying junction which is capable of generating a current in response to radiant energy impinging upon said outer region, and first and second electrodes connected to said [first] *outer* and [second] *inner* regions *respectively* for coupling said device into an external circuit, *wherein said first electrode comprises a plurality of contacts electrically-connected to one another and to said outer region.*

34. A solar cell array comprising a plurality of tubular solar cell units, each unit comprising a tubular semiconductor body having a radiation-receiving outer surface and a rectifying junction closely adjacent to and generally parallel to said outer surface, at least two of said solar cell units being disposed so that the said tubular bodies thereof are aligned end-to-end, means mechanically interconnecting said at least two solar cell units so that the said tubular bodies thereof are retained in end-to-end alignment, electrically conductive [contacts]

*electrodes* connected to said bodies at *respective* opposite sides of the said rectifying junctions [thereof], *one of said electrodes including a plurality of contacts electrically-connected to one another and to said radiation receiving outer surface* and means attached to the [contacts] *electrodes* of said at least two solar cell units for electrically interconnecting said at least two solar cell units.

35. A solar cell array according to claim 34 further including means for circulating a heat transfer fluid through the tubular bodies of said at least two solar cell units.

*36. A device according to claim 31 wherein at least said first electrode comprises a plurality of conductors conductively connected to each other and overlying said outer surface.*

*37. A device according to claim 36 wherein said second electrode comprises a continuous conductive film overlying said inner surface.*

* * * * *